US008450991B2

(12) United States Patent
Runas et al.

(10) Patent No.: US 8,450,991 B2
(45) Date of Patent: May 28, 2013

(54) CHARGE RECYCLING A 1 OF N NDL GATE WITH A TIME VARYING POWER SUPPLY

(75) Inventors: Michael Runas, McKinney, TX (US); Michael Seningen, Austin, TX (US)

(73) Assignee: Apple Inc., Cupertino, CA (US)

( * ) Notice: Subject to any disclaimer, the term of this patent is extended or adjusted under 35 U.S.C. 154(b) by 344 days.

(21) Appl. No.: 12/743,689

(22) PCT Filed: Nov. 19, 2008

(86) PCT No.: PCT/US2008/083962
§ 371 (c)(1),
(2), (4) Date: May 19, 2010

(87) PCT Pub. No.: WO2009/067470
PCT Pub. Date: May 28, 2009

(65) Prior Publication Data
US 2010/0253311 A1    Oct. 7, 2010

Related U.S. Application Data

(60) Provisional application No. 60/989,009, filed on Nov. 19, 2007.

(51) Int. Cl.
*H05F 3/02* (2006.01)

(52) U.S. Cl.
USPC ........... 323/311; 323/299; 323/280; 327/155; 327/142

(58) Field of Classification Search
USPC .......... 323/311, 299, 280, 281, 273; 327/155, 327/142, 143, 205, 206; 326/93, 95
See application file for complete search history.

(56) References Cited

U.S. PATENT DOCUMENTS

| 6,570,408 | B2 | 5/2003 | Nowka | |
| 8,035,426 | B1* | 10/2011 | Ecker et al. | 327/142 |
| 2012/0081157 | A1* | 4/2012 | Greenhill et al. | 327/155 |
| 2012/0200278 | A1* | 8/2012 | Yost et al. | 323/299 |

OTHER PUBLICATIONS

Search Report in Application No. EP 08852164.6-1233 / 2218184 PCT/US2008/083962.

* cited by examiner

*Primary Examiner* — Vibol Tan
(74) *Attorney, Agent, or Firm* — Meyertons, Hood, Kivlin, Kowert & Goetzel, P.C.

(57) ABSTRACT

This disclosure describes an invention that is a basic charge recycling gate 70 that includes a precharge node 75, a output charging network 78, an output pre-charge and null propagate network 77, an evaluation network 76, a first time varying power supply TVS0, a second time varying power supply TVS2, and a keeper circuit 79. Additionally, this disclosure describes an invention that is a time varying power supply 130 that includes a resonator circuit 131, an amplitude and power check circuit 135, one or more overshoot and an undershoot voltage clamps 1105 and 112, exciter circuits 137 and 136, and current monitor circuits 138 and 139. In addition, the invention includes frequency self tuning with the amplitude and power check circuit 135, capacitor banks 132 and 134, and the inductor tap select controller 133. Amplitude self tuning is provided by the amplitude sample and compare circuit 144. Further, a phase shift control circuitry 150 is also provided. And, distributed control switching circuitry 160 for power management is also provided.

11 Claims, 9 Drawing Sheets

CHARGE RECYCLING A 1 OF N NDL GATE WITH A TIME VARYING POWER SUPPLY

TECHNICAL FIELD

This disclosure relates to charge recycling with power supplies. More specifically, this disclosure relates to charge recycling a 1 of N NDL gate with a time varying power supply.

BACKGROUND

Charge recycling and adiabatic charging are two circuit technologies that can be employed to reduce the energy dissipated by an integrated circuit. These techniques are particularly useful in charging and discharging large capacitive loads or where the charging is performed in a cyclical fashion.

Conventional Charging

A large contribution to the total energy dissipated by an integrated circuit is the result of the charging and discharging of capacitive signal nodes within the circuit. This effect can be understood through the examination of a simple CMOS inverter as illustrated in FIG. 1.

Initially, the voltage across the capacitor 18 is zero and no energy is stored in the capacitor. The input signal 12 turns the P-channel MOSFET 14 off, and turns the N-channel MOSFET 16 on which grounds capacitor 18. When it is time to charge the capacitor 18, the P-channel MOSFET 14 conducts allowing current to flow from the power supply into the capacitor 18. Once the P-channel MOSFET 14 is conducting, the circuit can be modeled as a simple RC circuit 20 as illustrated in FIG. 2 which shows a power supply 22 supplying power to resistor 24 and capacitor 26. The RC circuit has the value of the resistor 24 as the "on" resistance of the MOSFET.

The energy dissipated in the circuit is the result of the current i(t) flowing through resistor 24 and is given by:

$$E_{diss} = \int_0^\infty i^2(t) R \, dt \qquad (1)$$

The current flowing through the resistor 24 is the same as that flowing through the capacitor 26, which is given by:

$$i(t) = C \frac{dV_c(t)}{dt} \qquad (2)$$

Combining equations 1 and 2 and solving the resulting expression, it can be seen that the energy dissipated in the resistance is $\frac{1}{2} CV^2$. It is important to note that due to charging with a constant voltage, the dissipation through the resistor is independent of the value of the resistor.

The charge necessary to charge the capacitor to the supply potential is equal to CV. This implies a total energy removed from the power supply is $CV^2$. However, the charge is delivered through the resistor R and, as indicated above, the energy dissipated through the resistor is $\frac{1}{2} CV^2$. Thus, one half of the energy removed from the power supply is dissipated in the resistor as heat, the other half going to charging the load.

When the load is discharged, i.e., the N-channel MOSFET conducts and discharges the capacitor to ground, a similar phenomenon occurs and another $\frac{1}{2} CV^2$ is dissipated in the resistance of the N-channel MOSFET.

In the conventional case, both the charging and discharging of the signal node capacitance results in a dissipation of $\frac{1}{2}$ $CV^2$. All of the energy sourced from the power supply is eventually converted to heat in the resistances.

Adiabatic Charging

In thermodynamics, when a process does not transfer heat to the working fluid, it is referred to as being adiabatic. This concept can be extended into electronics and specifically into the charging of signal nodes within an integrated circuit. If a signal node can be charged or discharged without dissipating energy in the resistance, then the charging process is adiabatic.

To realize an adiabatic charging process, it is necessary to have more precise control of how the capacitive load is charged over time. This can be achieved by using a time-varying power supply that starts at zero and ramps over time towards the desired supply voltage as illustrated in FIG. 3. The linear voltage ramps provides a constant current and limits the voltage across the resistance to an arbitrarily small level. The energy dissipated in the resistor is given by:

$$E_{diss}\left(\frac{RC}{T}\right) CV_{dd}^2 \qquad (3)$$

It is evident from equation 3 that the energy dissipated in the resistor for this charging scenario is a function of the period of the time-varying supply. Increasing the period results in less dissipated energy and, in the case where T>>RC, the dissipation approaches zero. With the use of a decreasing voltage ramp, the load capacitance can be discharged in an adiabatic fashion which results in the same expression for the energy dissipated.

When adiabatic charging and discharging are used together, the reduction in dissipated energy can be dramatic. Referring to FIG. 4, consider the case of a capacitive load in circuit 40 that has been discharged to ground at time $t_0$. For the example, it is assumed that the voltage source 42 is like an energy reservoir 41 storing $CV^2$ of energy and the capacitor 46 is like an empty energy reservoir 48 with the circuit 40 having the resistor 44.

In FIG. 5, When the capacitive load is charged, $\frac{1}{2} CV^2$ is delivered to the energy reservoir 58 that is the capacitor 56. Another RC/T $CV^2$ has been removed from the power supply reservoir 51 and dissipated as heat in resistor 54 in accordance with equation 3. Thus, a total of $(\frac{1}{2}+RC/T)CV^2$ is removed from the power supply reservoir 51 contrasted with the conventional charging case where the entire supply reservoir is emptied. When the load is discharged, another RC/T $CV^2$ is dissipated in resistor 54 as the energy is returned to the supply reservoir 51 leaving a total of $CV^2-2RC/T$ $CV^2$ in the supply 51 compared to the case of conventional charging where the supply reservoir is completely drained. In the limiting case where T>>RC, the circuit dissipates no energy in the resistor, and the charge drawn from the power supply to charge the capacitor is returned to the power supply when the capacitor is discharged.

Ordinary power supplies are incapable of dealing with the charge returned during an adiabatic discharge as it is usually dissipated to ground through a shunt impedance. This limitation renders the adiabatic discharging process no more efficient than the conventional discharging method. In order to take advantage of the of the returned energy, it is necessary to use a resonant source for the time-varying power supply as it is capable of reclaiming the returned charge, storing it, and making it available for use in subsequent clock cycles.

BEST MODE FOR CARRYING OUT THE INVENTION

This disclosure describes an invention that is a basic charge recycling gate 70 that comprises a precharge node 75; an output charging network 78 that couples to a signal output 72; an output pre-charge and null propagate network 77; an evaluation network 76 with a signal input 71 that couples to the precharge node 75 and to the output charging network 78 and the output precharge and null propagate network 77; a first time varying power supply TVS0 that couples to the precharge node 75 and the output charging network 78; a second time varying power supply TVS2 that couples to the evaluation network 76; and a keeper circuit 79 that couples to the signal output 72 and the evaluation network 76.

Additionally, this disclosure describes an invention that is a time varying power supply 130 that includes a resonator circuit 131, an amplitude and power check circuit 135, one or more overshoot and an undershoot voltage clamps 1105 and 112, exciter circuits 137 and 136, and current monitor circuits 138 and 139. In addition, the invention includes frequency self tuning with the amplitude and power check circuit 135, capacitor banks 132 and 134, and the inductor tap select controller 133. Amplitude self tuning is provided by the amplitude sample and compare circuit 144. Further, a phase shift control circuitry 150 is also provided. And, distributed control switching circuitry 160 for power management is also provided.

BRIEF DESCRIPTION OF DRAWINGS

To further aid in understanding the invention, the attached drawings help illustrate specific features of the invention and the following is a brief description of the attached drawings.

DISCLOSURE OF INVENTION

This disclosure describes a method and apparatus for charge recycling a 1 of N NDL gate with a time varying power supply. This disclosure describes numerous specific details in order to provide a thorough understanding of the present invention. One skilled in the art will appreciate that one may practice the present invention without these specific details. Additionally, this disclosure does not describe some well known items in detail in order not to obscure the disclosed invention.

The Basic Charge Recycling NDL Gate

In order to take advantage of the adiabatic charging and discharging processes described above, two circuit technologies are necessary. The first of these technologies is the logic gate itself.

Several different logic families have been developed to enable the charging and discharging processes described above. Each of these families have drawbacks ranging from requiring complete differential logic to low noise margin. A new logic family derived from a 1-of-N NDL topology solves these concerns and provides a robust circuit solution. The 1 of N NDL topology is Intrinsity Inc.'s proprietary FAST14® 1-of-N Domino Logic (NDL®) circuit technology. FAST14® and NDL® are registered trademarks of Intrinsity, Inc. FAST14 Technology and NDL gates are better described in U.S. Pat. Nos. 6,069,497 and 6,118,304, both of which are incorporated by reference for all purposes into this specification.

Figure 1:
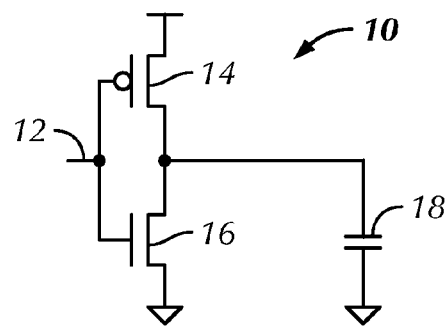
FIG. 1 illustrates a simple CMOS inverter.
Figure 2:
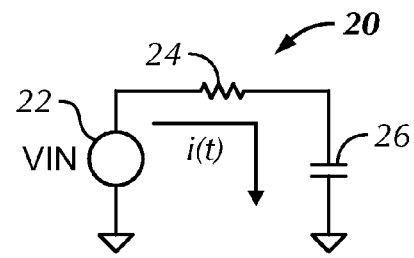
FIG. 2 illustrates the electrical modeling of a simple RC circuit.
Figure 3:
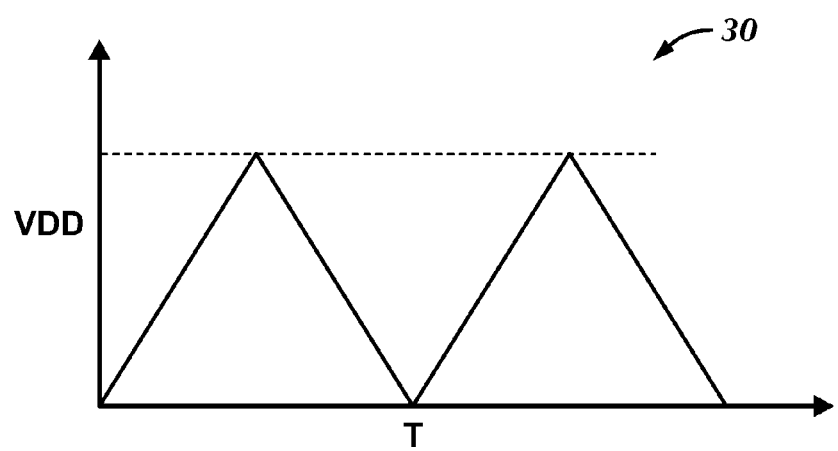
FIG. 3 illustrates the voltage over time of a time varying power supply.
Figure 4:
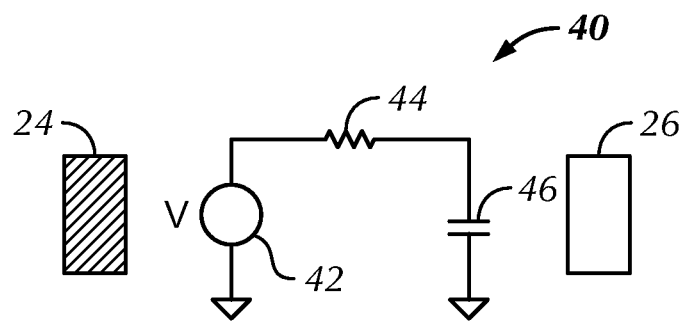
FIG. 4 illustrates the initial circuit state of an electrical model of the time varying power supply.
Figure 5:
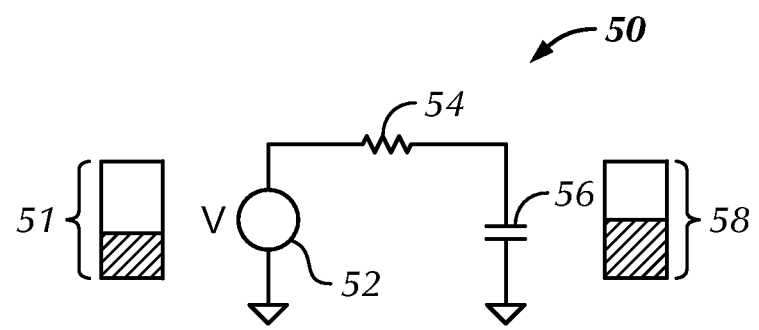
FIG. 5 illustrates the circuit state of the time varying power supply after the capacitor is charged.
Figure 6:
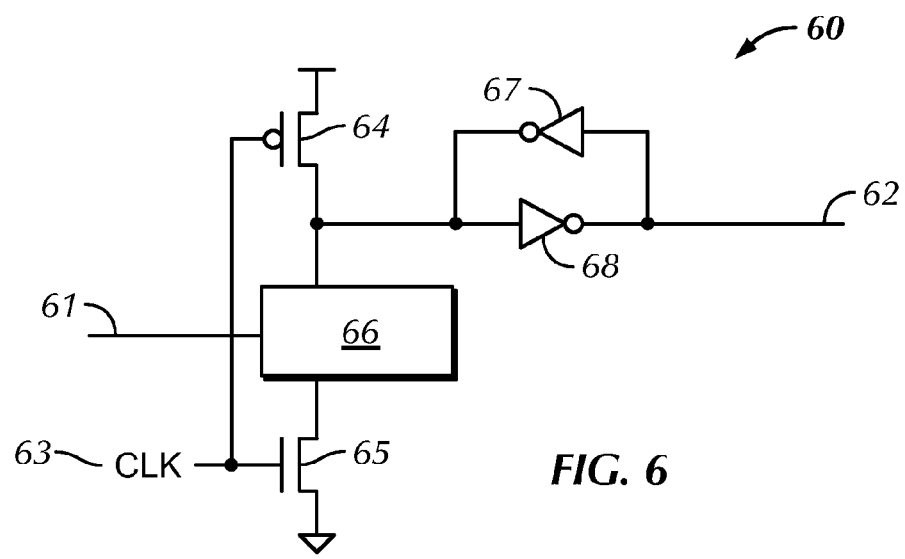
FIG. 6 illustrates an exemplary 1 of N NDL gate.

Referring to FIG. 6, a 1-of-N NDL gate 60 is an ideal starting point for creating a charge recycling logic family. Gate 60 comprises a pre-charged node, i.e., the top-of-stack, that is discharged through the evaluation network 66 if the logical state of the inputs 61 is correct. The value of the top-of-stack node is output to other gates through inverter 68.

P-channel MOSFET 64 is responsible for the pre-charge of the top-of-stack node. When CLK 63 is low, PFET 64 conducts and charges the top-of-stack to the supply voltage. When CLK goes high, PFET 64 is turned off and the gate 60 begins to evaluate.

During evaluation, N Channel MOSFET 65 conducts and, depending on the state of the inputs, the top-of-stack node discharges to ground. The evaluation network 66 comprises various combinations of N-channel MOSFETs coupled together to implement a given logic function based on the 1-of-N encoded data inputs.

As with all dynamic logic circuits, there is a risk of unintended discharge of the top-of-stack node due to spurious noise on one or more the inputs. To combat this, a full keeper (which is inverter 68 and inverter 67 combined) is used. By supplying a small amount of additional charge, the additional inverter 67 assists in keeping the top-of-stack voltage at the power supply level during noise, charge sharing, and undesirable coupling into the node. The inverter is sized to be sufficiently weak so that during a desired top-of-stack discharge, the evaluate stack has no difficulty overcoming the keeper inverter.

Figure 7:
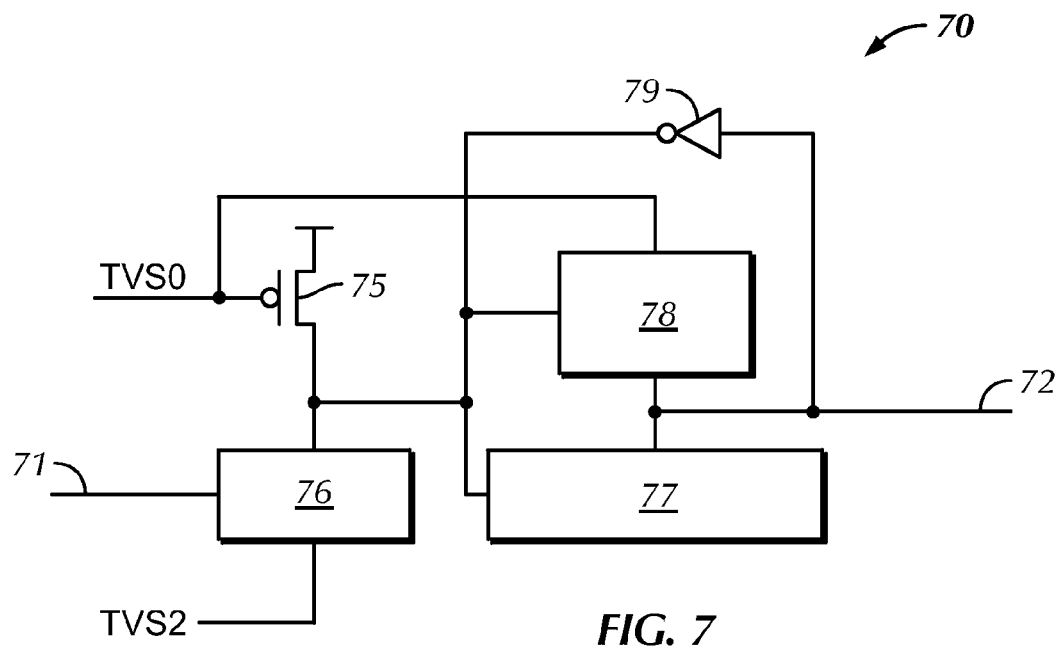
FIG. 7 discloses an embodiment of the basic charge recycling NDL gate.

Several key changes are required to a basic NDL gate to allow it to be used in a charge recycling system. The first of these changes involves the output inverter 68 of FIG. 6. Referring now to FIG. 7 that discloses a basic charge recycling NDL gate 70, the output inverter has been replaced by two networks that control the charging and discharging of the data output. The first network, output charging network 78, connects the output 72 to the first time-varying power supply TVS0 when the gate 70 evaluates, i.e., the top-of-stack discharges, to adiabatically charge the output. As the first time varying supply begins its low going transition, the output charging network 78 continues the connection to the output 72 allowing the output to discharge in an adiabatic fashion.

One skilled in the art will appreciate that output charging network 78 may comprise appropriate circuitry to accomplish its task.

The second network, output pre-charge and null propagate network 77, ensures a solid ground level on the output 72 during pre-charge and maintains an active connection should the gate not evaluate (Null propagate). Null value propagation is better described in U.S. Pat. No. 7,053,664, which is incorporated by reference for all purposes into this specification. One skilled in the art will appreciate that output pre-charge and null propagate network 77 may comprise appropriate circuitry to accomplish its task.

A similar technique is employed to discharge the top-of-stack node in an adiabatic fashion. The evaluate device 65 of gate 60 has been removed and the bottom of the evaluation network has been connected directly to a second time-varying power supply TVS2. Assuming the input data 71 is such that gate 70 will evaluate, as time-varying power supply TVS2 transitions to a low state, the top-of-stack node will follow, approximating an adiabatic discharge which limits the dissipation through the MOSFETs in the evaluation stack. As time-varying power supply TVS2 transitions to a high state, the top-of-stack node is charged in an adiabatic fashion up to $V_{dd}$-$V_{th}$. PFET 75 finishes the pre-charge of the top-of-stack.

Finally, by connecting PFET 75 to one of the time varying power supplies, the gate capacitance of the FET is charged and discharged in an adiabatic fashion thus reducing dissipation and allowing for more charge recycling.

It is also important to note that inverter 79 is still present in the charge recycling version of the NDL gate. This maintains similar noise immunity characteristics to the conventional style gate.

The charge recycling version of the NDL gate maintains the same basic topology but, as described above, allows both the top-of-stack capacitance and the output load capacitance to be charged and discharged in a fashion that approximates the adiabatic ideal. As such, this gate dissipates less energy than its conventional counterpart and allows for a portion of the energy stored in the aforementioned capacitances to be recycled reducing the overall power consumption.

The Time-Varying Power Supply

The second crucial circuit technology to realize the benefits of the adiabatic charging and discharging is the time varying power supply. As previously indicated, a power supply that varies in time is necessary to control the charging and discharging of signal nodes in an adiabatic fashion. Furthermore, the time varying power supply must allow for the reclamation (recycling) of the charge returned during the adiabatic discharge process. During the charging portion of the cycle, the time varying power supply sources the necessary energy to charge the load. When the load is discharged, the time varying power supply functions as a energy sink, reclaiming that energy from the load not dissipated as heat in the circuit's resistances and storing it for use during the next charging cycle.

A resonant circuit comprising an inductor and the aggregate on-chip capacitance is the best choice for generating the necessary time varying power supplies. The use of inductance will generate voltage waveforms that are sinusoidal. While this is not the ideal linear voltage ramp described above, it serves as a close approximation. Finally, care must be given in the resonator circuitry to minimize dissipation and allow for phase locking to the master time reference.

The Resonator

Figure 8:
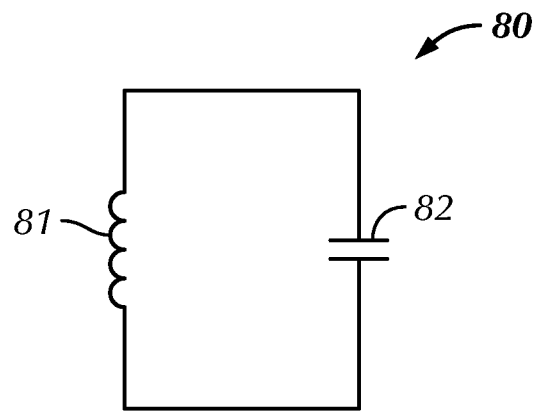
FIG. 8 illustrates a simple inductive circuit.

One technique to create a power supply capable of recycling the energy saved in the adiabatic charging process involves the use of an inductor. Referring now to FIG. 8, the idea is to create a resonant circuit comprising the inductor 81 (either internal or external to the chip) and the on-chip capacitance 82 (with or without on or off chip ballast capacitance). The resonant frequency of the circuit is given by:

$$\omega_0 = \frac{1}{\sqrt{LC}} \quad (4)$$

If the inductor value is chosen such that the circuit resonates at the desired clock frequency, little energy is required to keep the circuit operating. Furthermore, the energy stored in the electric field of the capacitor can be transferred (less dissipation) to the magnetic field of the inductor during the adiabatic discharge process, thus enabling charge recycling.

Figure 9:
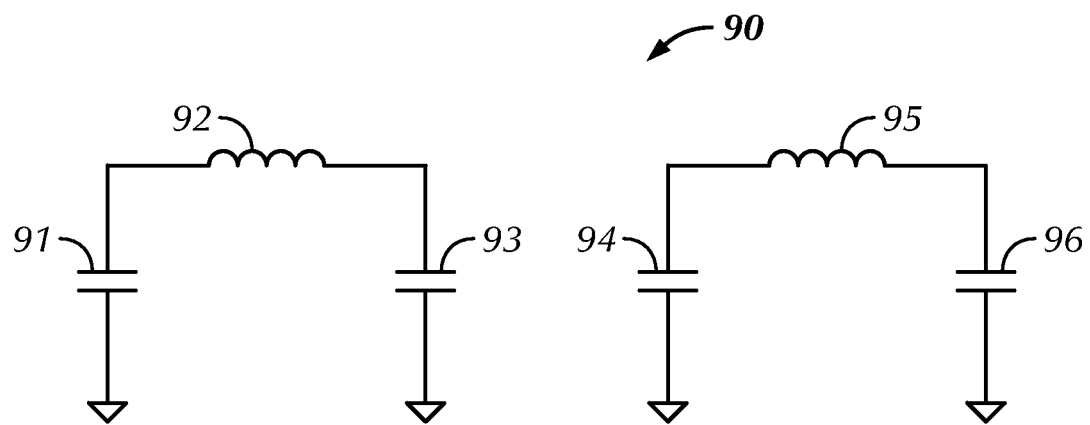
FIG. 9 illustrates the extension of a simple LC circuit to four phases.

The simple LC circuit above can be extended to provide the four phases necessary for the operation of the aforementioned recycling NDL gates. Referring now to FIG. 9 and circuit 90, the addition of a second inductor and a division of the capacitive load into four equal components accomplishes this task. Each of the two separate tank circuits creates (91, 92, 93 and 94, 95, 96) two clock phases 180° out of phase with each other. The excitation circuitry for the tanks can be used to induce the necessary 90° phase shift between the two tank circuits thus creating the required four clock phases.

Figure 10:
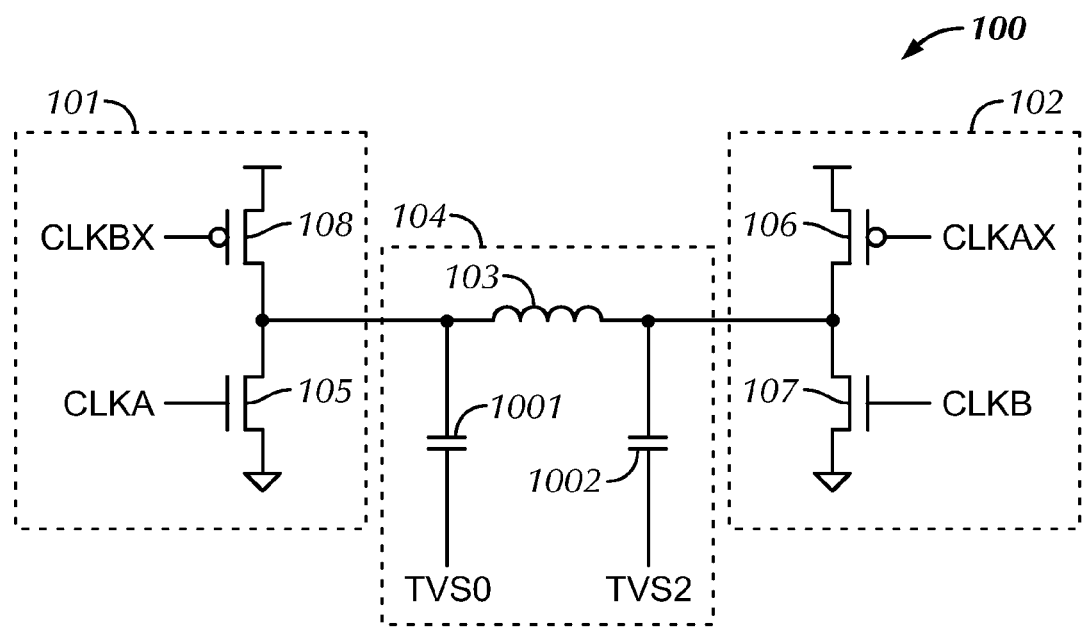
FIG. 10 illustrates an embodiment of the individually clocked 2N2P LC exciter circuit.

Referring now to FIG. 10, the excitation circuit that is the best for choice for the recycling NDL gate is the individually-clocked 2N2P arrangement. The resonator circuit 104 comprises inductor 103, capacitors 1001 and 1002, which produces a first time varying power supply TVS0 and a second time varying power supply TVS2. PFET 108 and NFET 105 form a first excitation circuit 101 for CLKA and CLKBX, and PFET 106 and NFET 107 form a second excitation circuit 102 for CLKB and CLKAX.

In this circuit 100, the individual transistors (104, 105, 106, 107) are activated with non-overlapping clock pulses derived from the master time reference. By using such pulses, it is possible to individually control the time each transistor is activated thus allowing for the circuit to be "tuned" to provide the minimum amount of energy necessary to excite the tank into resonance. The pulse driven arrangement also minimizes shoot-through current common in these types of structures by ensuring that a PFET and a NFET on the same side of the inductor are not on at the same time, e.g., 104-105 and 106-107.

Since the overall system requires four clock phases (CLKA, CLKAX, CLKB, CLKBX), two excitation circuits are required, one each connected across the inductor. Capacitors 1001 and 1002 could either be discrete capacitors or they could be the capacitance associated with TVS0 or TVS2.

Overshoot and Undershoot Clamps

When inductors are employed in electric circuits, care must be taken to ensure that large voltages are not developed. At resonance, the voltage gain of a RLC circuit can be significant and generate voltages in excess of the power supplies, i.e., voltages above VDD and below ground.

Such excursions beyond the power supply range can stress or damage the circuits on the chip. For example, voltages larger than the recommended supply voltage can damage the gate oxide of a MOSFET rendering the device inoperable. It is also possible to forward bias the intrinsic diodes formed at the source and drain regions of MOSFETs. When this happens, carriers are injected into the substrate and, if the carriers are sufficient in quantity, trigger the effect known as latch-up.

Figure 11:
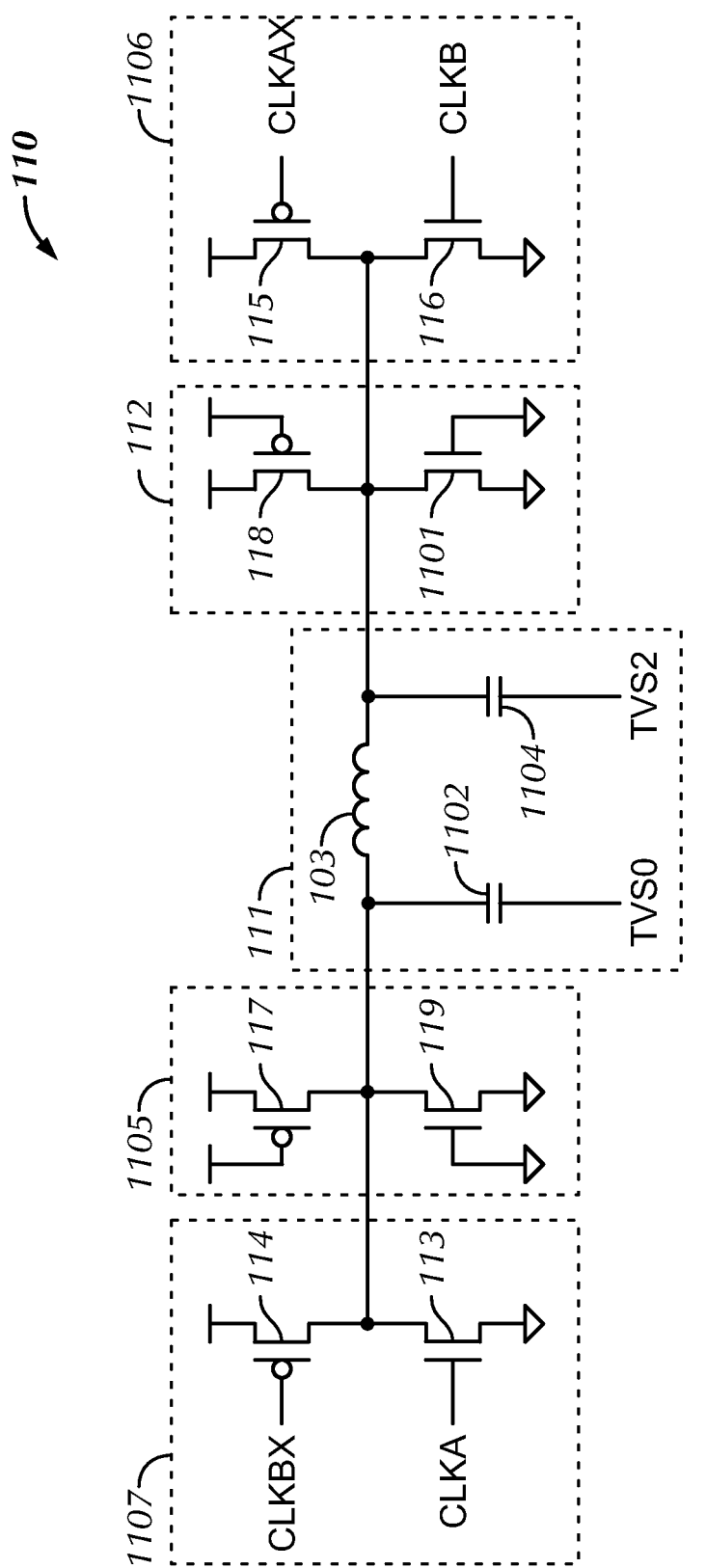
FIG. 11 discloses an embodiment of the exciter circuit with overshoot and undershoot voltage clamps.

To prevent the excursions from initiating undesirable effects, voltage clamps can be added as illustrated in FIG. 11 with circuit 110. Circuit 110 comprises a resonator circuit 111 with exciter circuits 1107 and 1106. Resonator circuit 111 comprises inductor 1103 and capacitors 1102 and 1104 and produces the first time varying power supply TVS0 and the second time varying power supply TVS2. Excitation circuit 1107 comprises PFET 114 and NFET 113 with CLKA and CLKBX; while excitation circuit 1106 comprises PFET 115 and NFET 116 with CLKB and CLKAX. [60] In this circuit, first clamp circuit 1105 and second clamp circuit 112 are implemented as diode-connected MOSFETs. The first clamp circuit 1105 comprises PFET 117 and NFET 119; while the second clamp circuit 112 comprises PFET 118 and NFET 1101. In operation, if TVS0 attempts to go above the supply voltage VDD, PFET 117 will activate and the excess energy in the tank will be shunted into the positive power supply. A similar effect happens if TVS0 swings below ground where NFET 119 will activate to hold the time-varying supply at ground. The second clamp circuit 112 with PFET 118 and NFET 1101 performs the same functions for TVS2.

While the clamps shown are implemented as diode-connected MOSFETs, any structure that allows for a connection between the time varying supplies and the power supplies when the time varying supplies move beyond the supply voltages would be acceptable. For example, the diode-connected MOSFETs could be replaced by explicit PN diodes. In addition, one skilled in the art will appreciate that the clamp circuits can be incorporated into the excitation circuits.

Frequency Self-Tuning

The charge recycling NDL system provides maximum power reduction when the LC tank circuit that comprises an explicit inductor and the aggregate capacitance of the time varying power supply nodes is driven at its resonant frequency. During the design process, the total capacitance is estimated from the mask data and the inductor value chosen to achieve resonance at the desired clock frequency. However, variations in the manufacturing process can result in a different capacitance than what was estimated and which will cause the resonant frequency of the circuit to be at a different frequency than desired. A mechanism is needed that allows the LC tank circuit to be re-tuned to the proper frequency post-fabrication.

Figure 12:
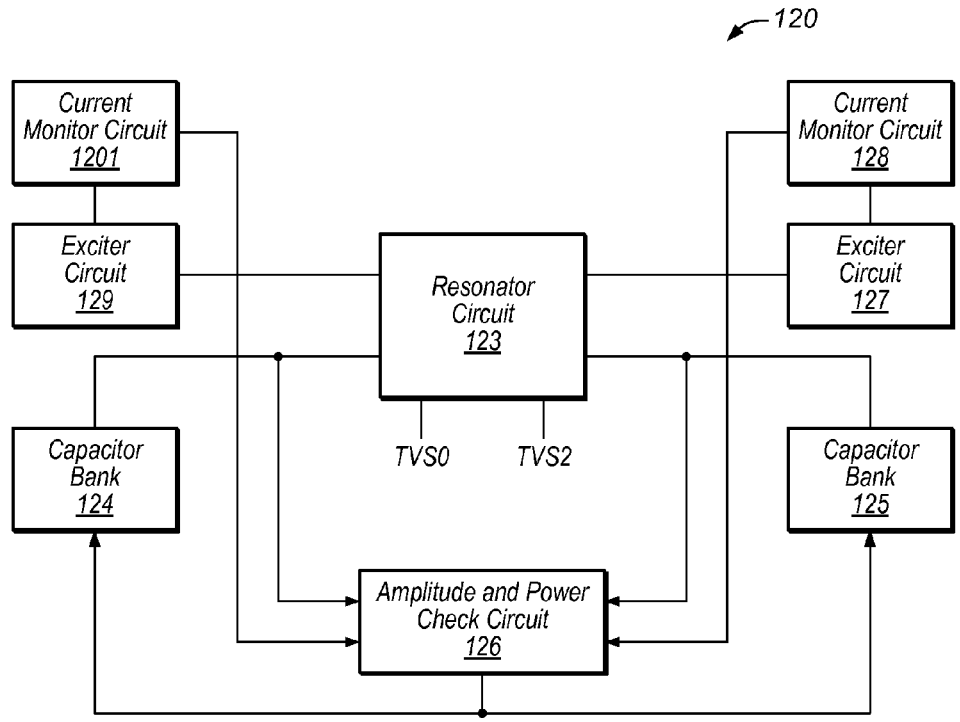
FIG. 12 discloses an embodiment of the time varying power supply with capacitor banks for frequency self tuning.

In the event that actual capacitance is less than what was anticipated, additional capacitance can be added as illustrated in FIG. 12 in small increments until the tank circuit resonates at the desired frequency. The circuit 120 comprises a resonator circuit 123 with time varying power supply nodes TVS0 and TVS2. As previously described in FIGS. 10 and 11, exciter circuits 129 and 127 are coupled to the resonator circuit 123. And as previously described, one skilled in the art will appreciate that clamp circuits as described above may be incorporated into the exciter circuits.

Circuit 120 also comprises current monitor circuits 1201 and 128. One skilled in the art will appreciate that these circuits may comprise appropriate circuitry to limit the current flowing into and out of resonator 123.

To determine if resonator circuit 123 is resonating, both the amplitude of the time varying power supplies and the current being drawn by the exciter circuits need to be monitored. As resonator circuit 123 approaches resonance, the amplitude of the time varying power supplies will be at their largest value and the current sourced to the resonator circuit by the exciter circuits will be at a minimum. If this is not the situation, the amplitude and power check circuit 126 can connect additional capacitance into the time varying power supply nodes until resonance is achieved such as illustrated by capacitor banks 124 and 125. Although the topology shown is for the case where additional capacitance is required, it is also possible to connect additional capacitors in series with the time varying power supply nodes thereby decreasing the total capacitance. In addition, one skilled in the art will appreciate that the amplitude and power check circuit 126 may comprise appropriate circuitry to control and monitor the amplitude and power of the time varying power supply nodes.

Figure 13:
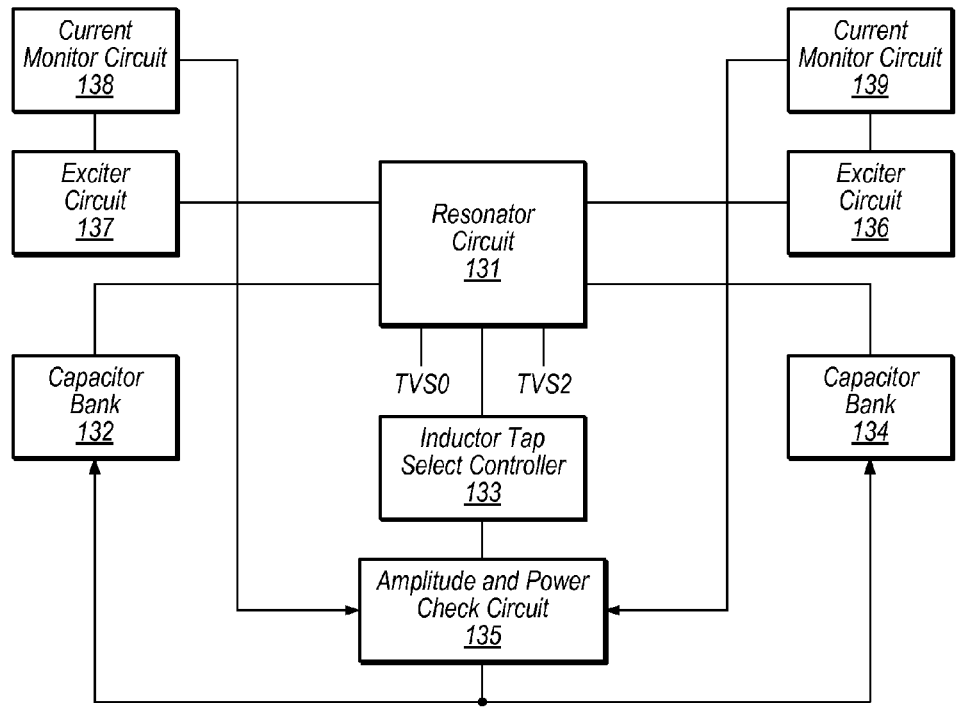
FIG. 13 discloses an embodiment of the time varying power supply with adjustable inductance.

Assuming that the inductor of the resonator circuit is fabricated on the chip, it is also possible to re-tune the resonator circuit by changing the value of the inductor as is illustrated in FIG. 13.

Circuit 130 comprises a resonator circuit 131 with time varying power supply nodes TVS0 and TVS2. As previously described, exciter circuits 136 and 137 are coupled to resonator circuit 131. One skilled in the art will appreciate that clamp circuits as described above may be incorporated into the exciter circuits. Circuit 130 also comprises current monitor circuits 138 and 139. And as previously illustrated, circuit 130 additionally comprises capacitor banks 132 and 134 with amplitude and power check circuit 135.

The inductor of the resonator circuit 131 can be tapped at one or more locations within the spiral allowing several different values of inductance from a single fabricated inductor and controlled by inductor tap select controller 133. The amplitude and power check circuit 135 generates signals to control the inductor tap select circuit 133. Based on the value of the control signals, a different tap is selected as the second terminal of the inductor, thus varying the value of the inductance in the circuit and changing the resonant frequency. The procedure is repeated until resonance at the desired clock frequency is achieved. One skilled in the art will appreciate that tap select circuit 133 may comprise appropriate circuitry to adjust the inductance of resonator circuit 131.

It is also possible to combine both of the previous two methods so that the circuit's resonant frequency can be altered by adjusting either or both the capacitance and/or inductance of the circuit.

Amplitude Self-Tuning

One of the challenges presented with the use of time varying power supplies is the consequences of clock gating. In a traditional design, the clock connected to unused portions of circuitry is stopped, thus saving power by eliminating switching in the aforementioned unused circuits. When the circuit is needed, the clock is re-activated allowing the circuit block to perform its designated function. With time varying power supplies, however, the situation is more complicated.

When a time varying power supply is disconnected from an unused circuit block, a portion of the capacitive load that forms the resonant circuit is also disconnected. The removal of capacitance causes a shift in the resonant frequency of the system as well as an increase in the amplitude of the power clocks. In order to realize a power savings associated with disconnecting the unused circuit block, it is necessary to adjust the amplitude of the time varying power supplies so that less energy is added to the system.

Figure 14:
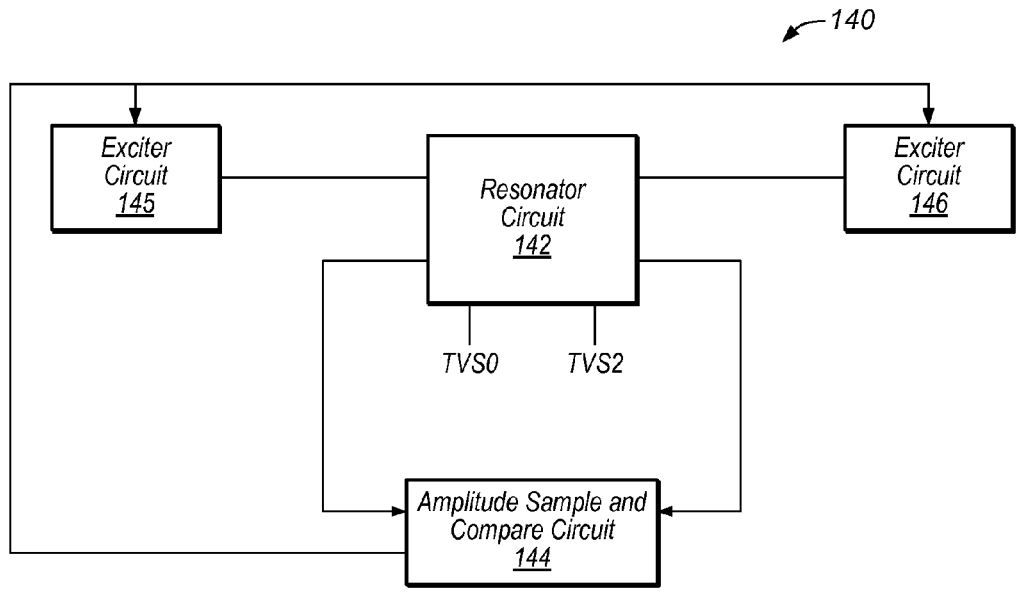
FIG. 14 discloses an embodiment of the time varying power supply with amplitude self tuning.

Referring now to FIG. 14, a feedback mechanism is employed in order to regulate the amplitude of the time varying power supplies. In this case, each time varying power supply is sampled near the terminals of the inductor. Circuit 140 comprises resonator circuit 142 with time varying power supplies TVS0 and TVS2. Coupled to resonator circuit 142 are exciter circuits 145 and 146 and amplitude sample and compare circuit 144. The sampled peaks of the time varying power supplies TVS0 and TVS2 are compared against the supply voltage and ground and a control signal is adjusted accordingly by amplitude sample and compare circuit 144. If the amplitudes of the time varying power supplies are too low, the control signal is adjusted such that the two exciter circuits supply extra energy to the resonator circuit. If the amplitudes of the time varying power supplies are too large, i.e., the peak-to-peak voltage is larger than the power supply voltage, then the control signal is adjusted such that the exciter circuits supply less energy too the circuit. The natural dissipation within the resonator circuit is relied upon to remove the excess energy and reduce the amplitude of the time varying power supplies.

The method by which the exciter circuit supplies more or less energy can be realized in two fashions. The first method, relies on an analog based control signal from amplitude sample and compare circuit 144. The analog signal controls the bias point of the drive MOSFETs within the exciter circuits, effectively making the MOSFETs stronger or weaker as needed. The second method relies on a digital control signal composed of one or more bits. The digital word encoded in the control signal is used to activate or deactivate portions of a collection of MOSFETs that comprise the drive devices within the exciter circuits. As the value of the digital word changes, different numbers of MOSFETs are made active, thus changing the effective size of the drive device thereby changing the amount of energy applied to the circuit.

Another method by which the power savings of clock gating can be realized involves the use of additional ballast capacitance. When a portion of the capacitive load is disengaged, it can be replaced by additional ballast (balanced on both sides of the inductor). This will maintain the proper resonant frequency and remove the need for adjusting the exciter circuits as the time varying power supplies will maintain their desired amplitude. Since the ballast capacitance will be connected directly to a time varying power supply, it will be charged and discharged in an adiabatic fashion resulting in a power savings from where the full load is connected (the charging and discharging of the circuit loading is only partially adiabatic).

Phase Shift Control

In conventional NDL, controlling the phase relationship between the various clocks can be desirable. Clock phases 0 and 2 are generally 180° out of phase. This is the same for clock phases 1 and 3. At FMAX, an approximate 90° phase shift is desired between the two groups of clocks phases which is generally accomplished using a fixed delay circuit.

The phase relationships for the time-varying supplies in the charge recovery NDL implementation are similar. The 180° phase shift between phases 0 (1) and 2 (3) remains the same. Generally, FMAX is achieved when the overlap of even and odd phases are maximized. Therefore, a precise 90° phase shift between phases 0 and 1 (2 and 3) is desirable.

The 180° phase shift between phases 0 and 2 (1 and 3) is inherent in the use of the inductor to create the time-varying supplies. The reactance of the inductor provides an exact 180° phase shift between its two terminals when used in this fashion. With the use of two inductors, the 180° phase relationship between phases 0 and 2 (1 and 3) is achieved.

Figure 15:
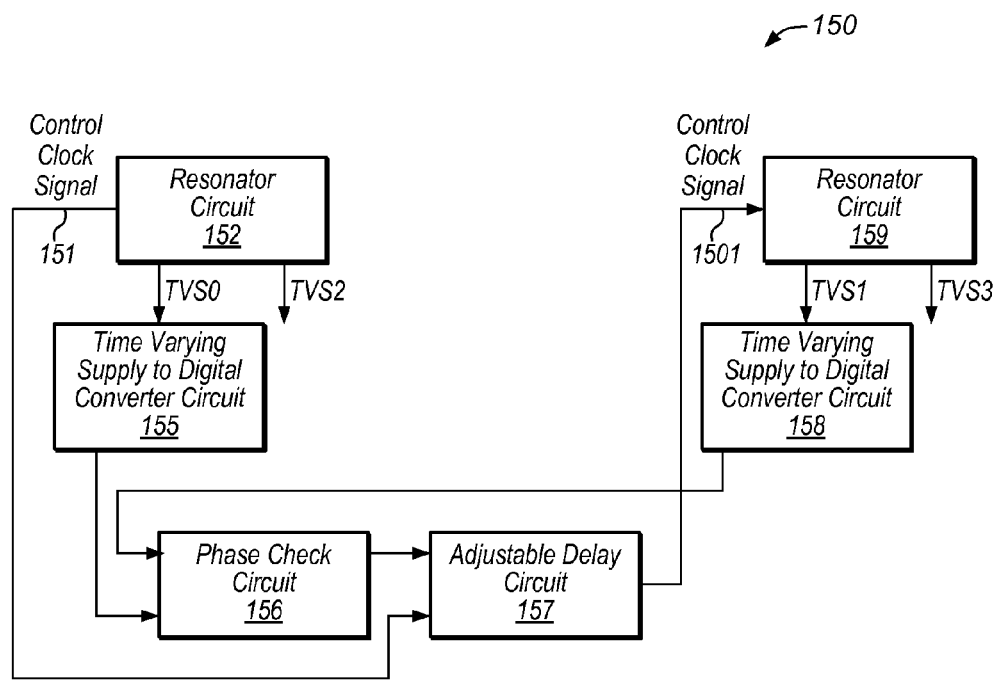
FIG. 15 discloses a phase shifting system for an embodiment of the time varying power supply.

In order to ensure the desired 90° phase shift between the two groups of time varying power supplies, a system that samples the time varying power supplies, compares their relative phases and adjust the control clock delay is employed as is illustrated in FIG. 15 and circuit 150. Circuit 150 comprises resonator circuit 152 with time varying power supply nodes TVS0 and TVS2 and resonator circuit 159 with time varying power supply nodes TVS1 and TVS3. For simplicity, the resonator circuits do not show additional circuitry as previously discussed and includes the exciter circuits, clamping circuits, current monitor circuits, capacitor banks, amplitude and power check circuits, inductor tap select controller circuits, and amplitude sample and compare circuits.

The phase 0 time varying power supply TVS0 is sampled and converted to a digital signal by Time Varying Supply to Digital Converter circuit 155 so that the phase comparison can more easily accomplished. The same is done for the phase 1 time varying power supply TVS1 by Time Varying Supply to Digital Converter circuit 158. One skilled in the art will appreciate that TVS2 and TVS3 may be used as well. Additionally, one skilled in the art will appreciate that appropriate circuitry may comprise the time varying supply to digital converter circuits to achieve their tasks.

Once the time varying power supplies signals have been converted to digital signals, the relative phase difference between the two phases is determined by the phase check circuit 156. In the ideal circumstance, the difference between the two signals is 90° and no action is taken. If, however, the phase difference between phases 0 and 1 is larger than the desired 90°, then the amount of delay in the adjustable delay circuit 157 is reduce. Additional delay is added in the adjustable delay circuit 157 should the phase difference between the two signals be smaller than the specified 90°. One skilled in the art will appreciate that appropriate circuitry may comprise the phase check circuit and the adjustable delay circuit to achieve their tasks.

The system continuously adjusts the delay of control clock signal 1501 for the phase 1-3 resonator circuit 159 relative to the control clock signal 151 of resonator circuit 152 to maintain the desired phase relationship between the two phase groups. With this type of system, variations due to process, supply voltage, and temperature can be compensated for allowing the desired phase relationships.

Distributed Control Switches

Figure 16:
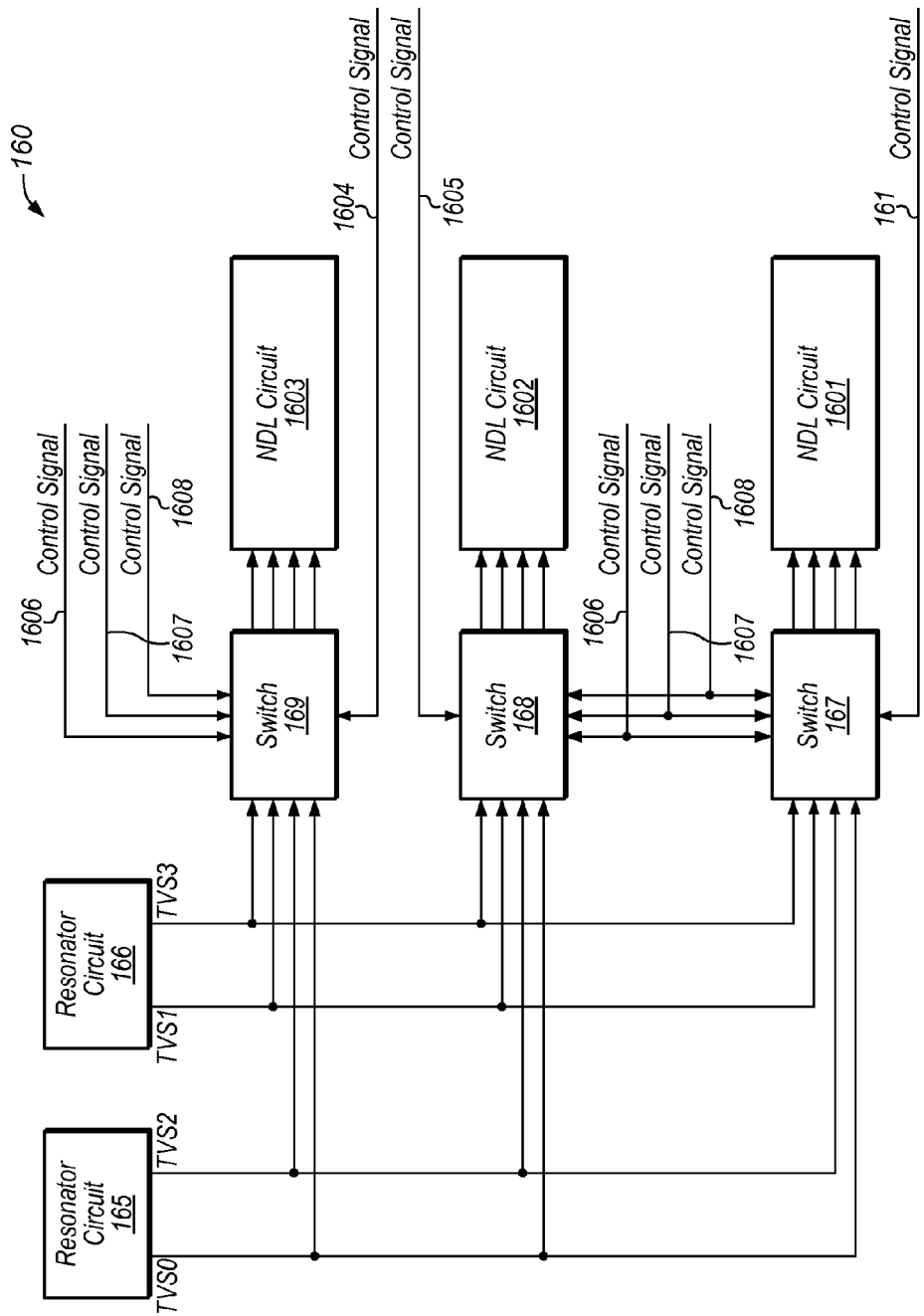
FIG. 16 discloses of an embodiment of the time varying power supply using distributed control switches.

As a method to save power, a technique called clock gating is often employed. This method disengages the clock from unused circuit blocks so that the circuits within the block do not needlessly switch and consume power. A similar technique can be employed with the charge recycling NDL logic circuits as illustrated in FIG. 16 with circuit 160. Circuit 160 comprises resonator 165 with time varying power supply nodes TVS0 and TVS2 and resonator 166 with time varying power supply nodes TVS1 and TVS3. For simplicity, the resonator circuits do not show additional circuitry as previously discussed and includes the exciter circuits, clamping circuits, current monitor circuits, capacitor banks, amplitude and power check circuits, inductor tap select controller circuits, amplitude sample and compare circuits, and phase delay circuitry.

Coupled to resonator circuits 165 and 166 are one or more switches 169, 168, through the Nth switch 167 (any number of switches). Each switch is controlled by its own control signal 1604 for switch 169, 1605 for switch 168, and the Nth control signal 161 for the Nth switch 167. Coupled to the switches are one or more NDL circuit blocks 1603, 1602, through the Nth circuit block 1601 (any number of NDL circuit blocks). One skilled in the art will appreciate that appropriate circuitry may comprise the switch circuits to achieve its task. Additionally, one skilled in the art will appreciate that the NDL circuit blocks may comprise a variety of NDL circuits that perform various tasks.

When the switches are closed, the time varying power supplies are passed on directly to the internal circuits within the appropriate NDL circuit blocks. If the system determines that one or more NDL circuit blocks are not needed for a period of time, the appropriate switch control signals are transitioned. The change in state of the switch control signals disconnects the internal circuits in the target NDL circuit block from the time varying power supplies and drives the local supply nodes to a known state to prevent odd behavior in the circuit and allow for easier startup when the block is needed.

In addition, the switches may comprise additional circuitry to provide additional clocks or signals such as illustrated by signals 1606-1608 to aid in testing, debug, alternate power supplies, etc. One skilled in the art will appreciate that the switch control signals will have to be supplemented with additional information to select which alternative clock will be connected to the intended circuit blocks.

To summarize, this disclosure describes an invention that is a basic charge recycling gate 70 that comprises a precharge node 75; an output charging network 78 that couples to a signal output 72; an output pre-charge and null propagate network 77; an evaluation network 76 with a signal input 71 that couples to the precharge node 75 and to the output charging network 78 and the output precharge and null propagate network 77; a first time varying power supply TVS0 that couples to the precharge node 75 and the output charging network 78; a second time varying power supply TVS2 that couples to the evaluation network 76; and a keeper circuit 79 that couples to the signal output 72 and the evaluation network 76.

Additionally, this disclosure describes an invention that is a time varying power supply 130 that includes a resonator circuit 131, an amplitude and power check circuit 135, one or more overshoot and an undershoot voltage clamps 1105 and 112, exciter circuits 137 and 136, and current monitor circuits 138 and 139. In addition, the invention includes frequency self tuning with the amplitude and power check circuit 135, capacitor banks 132 and 134, and the inductor tap select controller 133. Amplitude self tuning is provided by the amplitude sample and compare circuit 144. Further, a phase shift control circuitry 150 is also provided. And, distributed control switching circuitry 160 for power management is also provided.

Other embodiments of the present invention will be apparent to those skilled in the art after considering this disclosure or practicing the disclosed invention. The specification and examples above are exemplary only, with the true scope of the present invention being determined by the following claims.

We claim the following invention:

1. A time varying power supply, comprising:
a resonator circuit;
an amplitude and power check circuit that couples to said resonator circuit;
an exciter circuit that couples to said resonator circuit;
a current monitor circuit that couples to said resonator circuit; and
a frequency self tuning circuit coupled to said resonator circuit, wherein said frequency self tuning circuit further comprises said amplitude and power check circuit and a capacitor bank.

2. A method to make a time varying power supply, comprising:
providing a resonator circuit;
coupling an amplitude and power check circuit to said resonator circuit;
coupling an overshoot voltage and undershoot voltage clamp circuit to said resonator circuit;
coupling an exciter circuit to said resonator circuit;
coupling a current monitor circuit to said resonator circuit;
coupling a frequency self tuning circuit coupled to said resonator circuit, wherein said frequency self tuning circuit further comprises said amplitude and power check circuit, a capacitor bank, and the inductor tap select controller circuit;
coupling an amplitude self tuning circuit to said resonator circuit;
coupling a phase shift control circuitry to said resonator circuit; and
coupling a distributed control switching circuitry to said resonator circuit.

3. A method to use a time varying power supply, comprising:
providing power to a resonator circuit that couples to an overshoot voltage and undershoot voltage clamp circuit, an exciter circuit, a current monitor circuit;
monitoring said resonator with an amplitude and power check circuit;
self tuning the frequency of said resonator with a frequency self tuning circuit coupled to said resonator circuit, wherein said frequency self tuning circuit further comprises said amplitude and power check circuit, a capacitor bank, and the inductor tap select controller circuit;
self tuning the amplitude by coupling an amplitude self tuning circuit to said resonator circuit;
phase shifting the output signal with a phase shift control circuitry coupled to said resonator circuit; and
controlling the power consumption with a distributed control switching circuitry coupled to said resonator circuit.

4. The time varying power supply of claim 1, further comprising:
an overshoot voltage and undershoot voltage clamp circuit that couples to said resonator circuit;
an amplitude self tuning circuit coupled to said resonator circuit;
a phase shift control circuitry that couples to said resonator circuit; and
a distributed control switching circuitry that couples to said resonator circuit;
wherein the frequency self tuning circuit further comprises an inductor tap select controller circuit.

5. The time varying power supply of claim 1, wherein the resonator circuit produces multiple time varying power supply outputs having relative phase differences, and wherein the phase shift control circuitry adjusts the relative phase differences during operation of the time varying power supply.

6. The time varying power supply of claim 1, wherein the resonator circuit comprises an inductor having first and second terminals, a first capacitor coupled to the first terminal, and a second capacitor coupled to the second terminal, wherein the first capacitor produces a first time varying power supply output and wherein the second capacitor produces a second time varying power supply output.

7. The time varying power supply of claim 6, wherein the exciter circuit comprises a first PFET and a first NFET coupled to the first terminal and a second PFET and a second NFET coupled to the second terminal, wherein each of the first and second PFETs and the first and second NFETs is coupled to a corresponding one of four non-overlapping clock phases.

8. The time varying power supply of claim 6, wherein if the amplitude of the first and second time varying power supply outputs are too low relative to a ground voltage, the amplitude self tuning circuit adjusts the exciter circuit such that the exciter circuit supplies more energy to the resonator circuit, and wherein if the amplitude of the first and second time varying power supply outputs are too high relative to a supply voltage, the amplitude self tuning circuit adjusts the exciter circuit such that the exciter circuit supplies less energy to the resonator circuit.

9. The time varying power supply of claim 1, wherein the overshoot voltage and undershoot voltage clamp circuit comprises a first device coupled to a positive power supply and a second device coupled to a ground terminal, wherein if the resonator circuit attempts to go above a positive power supply voltage, the first device activates and shunts the resonator circuit to the positive power supply, and wherein if the resonator circuit attempts to go below a ground voltage, the second device activates and shunts the resonator circuit to the ground terminal.

10. The time varying power supply of claim 1, wherein if the resonator circuit is not at resonance during operation of the time varying power supply, the amplitude and power check circuit connects additional capacitance from the capacitor bank to the resonator circuit until resonance is achieved.

11. The time varying power supply of claim 10, wherein the resonator circuit comprises an inductor having multiple tap locations, and wherein the amplitude and power check circuit further selects a different one of the tap locations until resonance is achieved.

* * * * *